United States Patent [19]

Imamura et al.

[11] 4,179,719

[45] Dec. 18, 1979

[54] THIN FILM MAGNETIC HEAD

[75] Inventors: Nobutake Imamura, Tokyo; Yoshinori Mimura, Tachikawa; Toshihiko Kobayashi, Mitaka, all of Japan

[73] Assignee: Kokusai Denshin Denwa Kabushiki Kaisha, Japan

[21] Appl. No.: 762,232

[22] Filed: Jan. 25, 1977

[30] Foreign Application Priority Data

Apr. 28, 1976 [JP] Japan ................... 51-48929

[51] Int. Cl.² .......................... G11B 5/38; G11B 5/22
[52] U.S. Cl. .................................. 360/112; 360/122; 360/125
[58] Field of Search ............. 360/112, 113, 122, 123, 360/125, 126; 338/32 R, 32 S; 365/32, 34, 133

[56] References Cited

U.S. PATENT DOCUMENTS

| 3,200,207 | 8/1965 | Rainer et al. | 360/112 |
|---|---|---|---|
| 3,260,980 | 7/1966 | Weiss | 360/112 |
| 3,389,230 | 6/1968 | Hudson, Jr. | 360/112 |
| 3,425,047 | 1/1969 | Riggs | 360/112 |
| 3,643,035 | 2/1972 | Tsukagoshi | 360/112 |
| 4,079,430 | 3/1978 | Fusishima et al. | 360/126 |

OTHER PUBLICATIONS

IBM Tech. Disc. Bulletin, Magnetic Films for Hall Effect Devices Useful for Magnetic Recording Heads, R. J. Gambino et al., vol. 18, No. 12, May 1976, pp. 4214–4215.

IBM Tech. Disc. Bulletin, $Gd_xFe_y$ and GdCoFe Materials for Magnetic Head Hall Sensors, R. J. Gambino et al., vol. 18, No. 12, p. 4218, May 1976.

Primary Examiner—Alfred H. Eddleman
Attorney, Agent, or Firm—Robert E. Burns; Emmanuel J. Lobato; Bruce L. Adams

[57] ABSTRACT

A magnetic head for reading out the state of magnetization recorded on a magnetic recording medium, in which the magnetic head comprises a substrate of insulating material, an amorphous magnetic thin film, a pair of current terminals, and a pair of voltage terminals. The amorphous magnetic thin film is deposited on the substrate so as to have a width smaller than respective unit areas of magnetic records on a magnetic recording medium to be separately read out therefrom and to have an easy axis of magnetization in a direction perpendicular to the film surface. The current terminals are formed on the substrate for flowing a current in the amorphous magnetic thin film in the lengthwise direction thereof. The voltage terminals are formed on the substrate for deriving from the amorphous magnetic thin film a voltage induced in the transverse direction thereof.

8 Claims, 17 Drawing Figures

THIN FILM MAGNETIC HEAD

FIELD OF THE INVENTION

This invention relates to a magnetic head for reading out the state of magnetization recorded on a magnetic recording medium such as a magnetic tape, a magnetic card, a magnetic disk or the like.

BACKGROUND OF THE INVENTION

Magnetic heads of the core-type have been widely used for reading out the state of magnetization stored in a magnetic recording medium, such as a magnetic tape, a magnetic card or the like. Theoretically, this head is operated such that variations in the flux density, caused by electromagnetic induction when the medium moves, are read out in the form of the electric voltage. This magnetic head exhibits a very excellent characteristic in reading out analog signals. However, electromagnetic induction is utilized, and this has such a defect that when the tape speed is low, the output of the head is small, making it impossible to obtain high resolution power.

Further, as another detecting element, there has been proposed a so-called Hall element of semiconductor thin film. Since the Hall element produces a voltage in proportion to the intensity of magnetic field emanating from the recording medium, this is suitable for various applications and may be also employed as a read head. In this case, since the output of the Hall element is a voltage proportional to the magnetic field emanating from the recording medium, the Hall voltage varies with the kind of recording medium used and, in principle, the head has no memory function.

BRIEF SUMMARY OF THE INVENTION

An object of this invention is to provide a thin film magnetic head which makes use of the storing property of the film and an abnormal Hall effect of a magnetic substance unlike the conventional non-storing type head.

There is provided in accordance with this invention a thin film magnetic head comprising a substrate of insulating material, an amorphous magnetic thin film, a pair of current terminals, and a pair of voltage terminals. The amorphous magnetic thin film is deposited on the substrate so as to have a width smaller than respective unit areas of magnetic records on a magnetic recording medium to be separately read out therefrom and to have an easy axis of magnetization in a direction perpendicular to the film surface. The current terminals are formed on the substrate for flowing a current in the amorphous magnetic thin film in the lengthwise direction thereof. The voltage terminals are formed on the substrate for deriving from the amorphous magnetic thin film a voltage induced in the transverse direction thereof.

The amorphous magnetic film may be formed in the shape of a strip, a cross or a rhombic shape.

The amorphous magnetic thin film may be formed into a multilayer one.

BRIEF DESCRIPTION OF THE ACCOMPANYING DRAWINGS

The principle, construction and operation of this invention will be clearly understood from the following detailed description taken in conjunction with the accompanying drawings, in which.

Figure 6A:
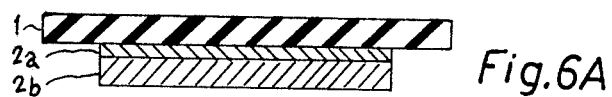
Figure 6B:
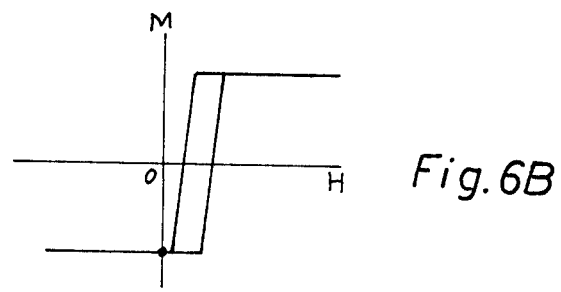
Figure 6C:
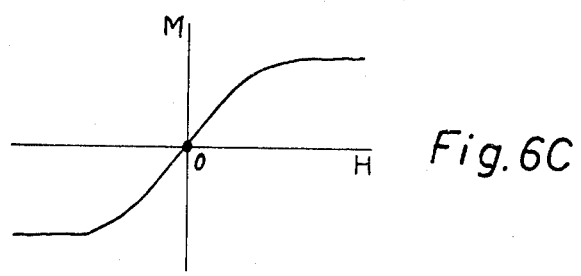
Figure 6D:
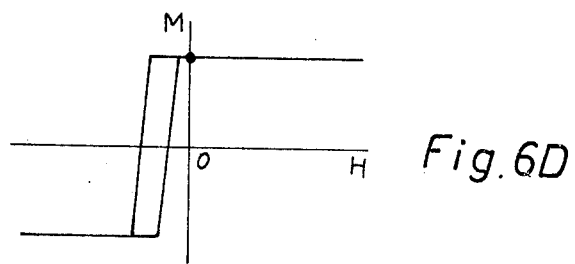

FIGS. 5A, 5B, 5C 5C and 5D are perspective view illustrating embodiments of this invention;

FIG. 6A is a section showing another example of an amorphous magnetic film for use in this invention; and FIGS. 6B, 6C and 6D are characteristic curves explanatory of the operation of the magnetic thin film shown in FIG. 6A.

DETAILED DESCRIPTION OF THE INVENTION

Figure 1A:
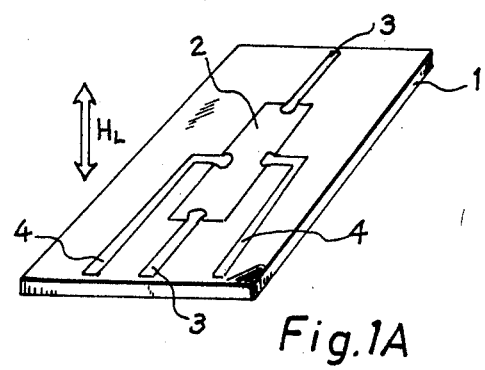
FIGS. 1A and 1B are a perspective view and a characteristic curve explanatory of the principle of the present invention.
Figure 1B:
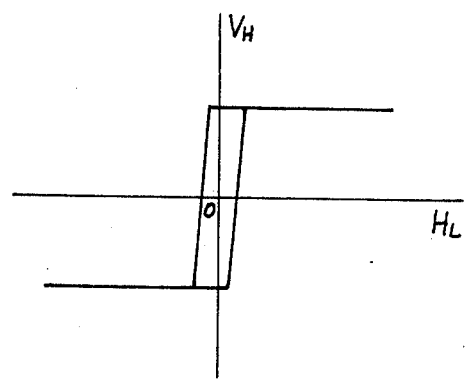

With reference to FIG. 1A, a magnetic head of the simple construction embodying this invention will be described. An amorphous Gd-Fe alloy film 2 is deposited by sputtering or vacuum evaporation on a glass substrate 1 and, if necessary, a non-magnetic substance such as $SiO_2$ is further deposited as a protective film. The composition of the amorphous Gd-Fe alloy film is selected such that Gd is in the range of 10 to 30%. It is known that an amorphous film lying in such a composition range and having a thickness of more than 500 Å has an easy axis of magnetization in a direction normal to the film surface. (N. Imamura et al: J. Phys. Soc. Japan, Vol. 39, No. 3 (1975) 829 and our U.S. Pat. No. 4,126,494). It is also known that when a magnetic field is applied perpendicularly to the surface of such an amorphous film, a Hall voltage presents a hysteresis characteristic similar to a magnetization curve in the direction perpendicular to the film surface. That is, the so-called Hall voltage, which is produced across voltage terminals 4 when a steady-state current has been applied across current terminals 3, as shown in FIG. 1A, has a hysteresis characteristic with respect to an external magnetic field, as shown in FIG. 1B. Accordingly, even when the external magnetic field is zero, the Hall voltage can be made to have a finite value. A Hall voltage of about 5 mV is obtained at a current of 10 mA. Further, it is indicated that the polarity of the Hall voltage can be readily changed by applying an external magnetic field exceeding a coercive force Hc. The magnetic thin film having an easy magnetic exis in a direction normal to the film surface can be produced from alloys containing Fe, Co, Ni, Mn and like elements at the rate of more than 50% or from other alloys containing, for example, a heavy rare earth element. In view of the fact that transition metals of the iron group such as Fe, Co, Ni, Mn, etc. mentioned above contribute to the Hall effect, it is necessary that an iron group element be contained at the rate more than 50%.

A more important point is that the Hall voltage is not determined only by the value of an external magnetic field but determined by the state (value and direction) of magnetization of the magnetic substance. Namely, the Hall voltage is dependent upon the area ratio of the magnetic domain of upward direction to the magnetic domain of downward direction along the direction normal to the film surface. Consequently, if the magnetized state of the Hall element can be controlled by the recording medium to be read out, the Hall element can be employed as a magnetic head.

Figure 2A:
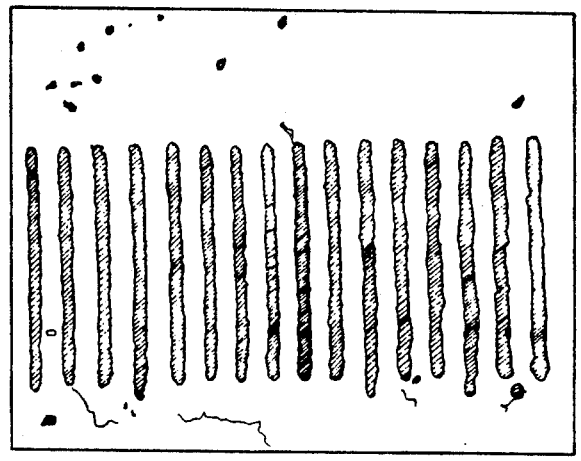
FIGS. 2A, 2B and 2C are diagrams each illustrating the magnetically recorded state of a magnetic recording medium to be read out by the magnetic head of this invention.
Figure 2B:
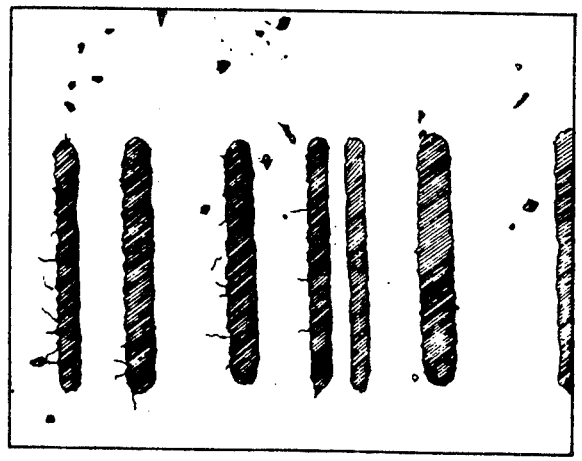
Figure 2C:
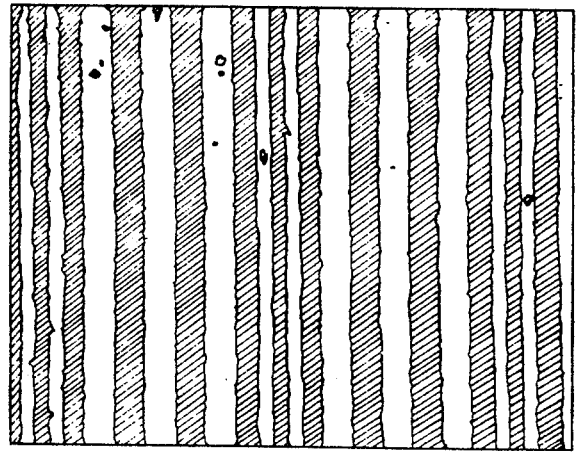

FIGS. 2A, 2B and 2C show magnetic domain patterns, observed through a Kerr magneto-optical microscope of fifty magnification, which were obtained on an amorphous Gd-Fe film by closely contacting it with a magnetic tape having stored therein the state "1" of a digital signal, showing that the digital signal of the state "1" on the magnetic tape has been completely transferred therefrom onto the Gd-Fe film. In FIGS. 2A, 2B and 2C, black parts each correspond to the state "1" and white parts the state "0". Accordingly, if the area of a Hall element is included within the area of the state "1" in the magnetic domain pattern, a positive Hall voltage is obtained by contact transfer when the magnetic tape has the information "1" while a negative Hall voltage is obtained in the case of "0" and accordingly, the Hall element performs the function of a magnetic head.

The thin film magnetic head of this invention, which utilizes the transfer techniques, has such an advantage that a stable output can be obtained as a Hall voltage regardless of the intensity of a stray field emanating from the recording medium. Moreover, the head of this invention does not utilize the detection by magnetic induction employed in conventional heads and hence has merits such that the travelling speed of the recording medium relative to the magnetic head has no relation to the output voltage. In view of the fact that the Hall voltage has a hysteresis characteristic, the magnetic head of this invention is mainly suitable for the detection of digital signals. However, if the recording pattern on the recording medium is appropriately devised, the magnetic head of this invention can be also employed for the detection of analog signals. An embodiment of this invention for the detection of digital and analog signals will hereinbelow be described.

Figure 3A:
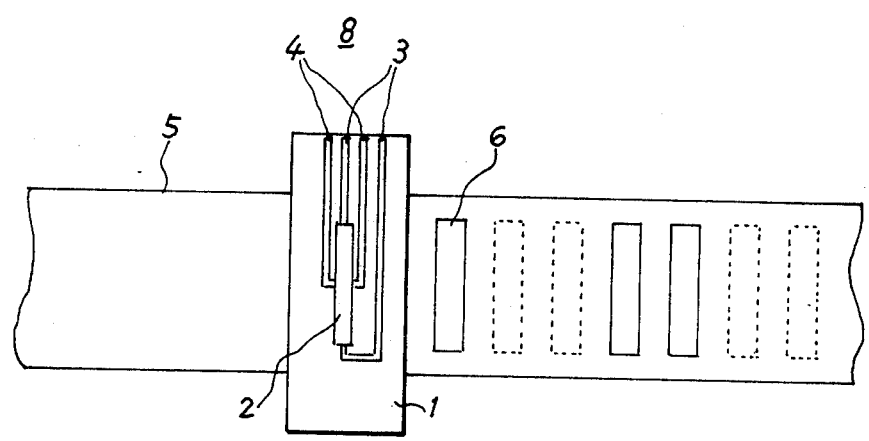
FIGS. 3A and 3B are a plan view and a waveform diagram illustrating an example of the operation of reading out a digital signal by the magnetic head of this invention.
Figure 3B:
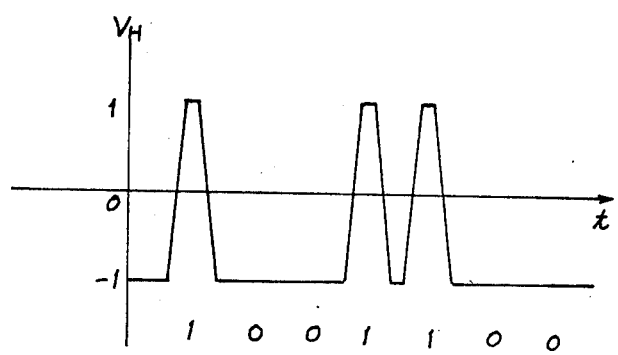

With reference to FIGS. 3A and 3B, an embodiment of this invention for reading out analog signals will be described. A head 8 is disposed opposite to the surface of a magnetic tape 5 as shown in FIG. 3A viewed from the back of the glass substrate 1. As shown in FIG. 3A, the Gd-Fe film 2, which is narrower than the width of a unit memory area 6 of a digital signal recorded on a magnetic tape, a magnetic card or the like record medium 5 and shorter than the length of the unit memory area 6, is deposited on an insulating substrate such as the glass substrate 1, and the current terminals 3 and the voltage terminals 4 are formed by thin films of a good conductive metal such as copper on the glass substrate 1 to extend in the lengthwise and widthwise directions of the Gd-Fe film, thus providing the magnetic head 8. When each memory area 6 of the magnetic tape or the like 5 passes near the head 8, the signal state of the unit memory area 6 is transferred onto the Gd-Fe film 2 of the head 8 to thereby produce a voltage. In FIG. 3A, digital signals of states 1001101 . . . are stored in a magnetic tape 5. In this case, the Hall voltage also varies in accordance with the states 1001101 . . . with time as shown in FIG. 3B.

Figure 4A:
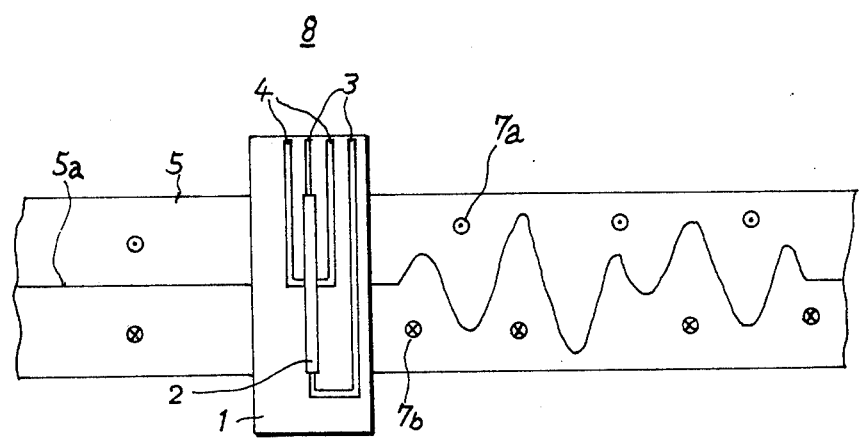
FIGS. 4A and 4B are a plan view and a waveform diagram showing an example of the operation of reading out an analog signal by the magnetic head of this invention.
Figure 4B:
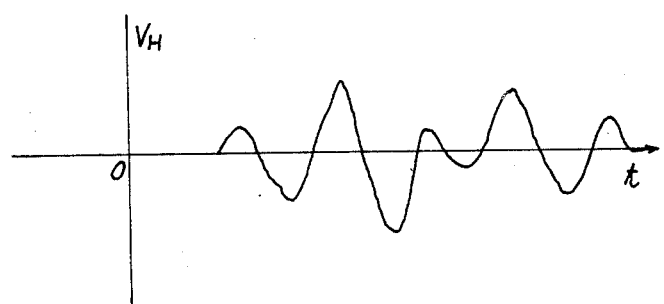
Figure 5A:
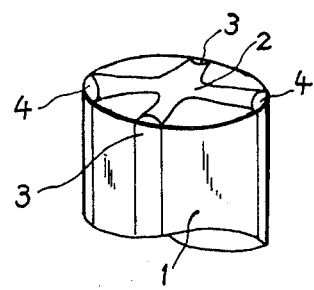
Figure 5B:
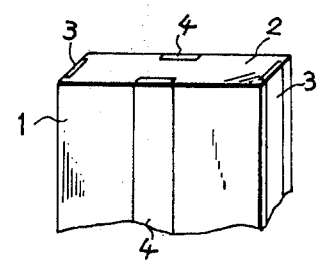
Figure 5C:
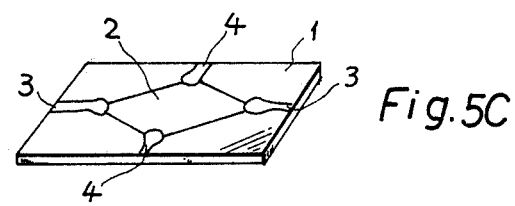
Figure 5D:
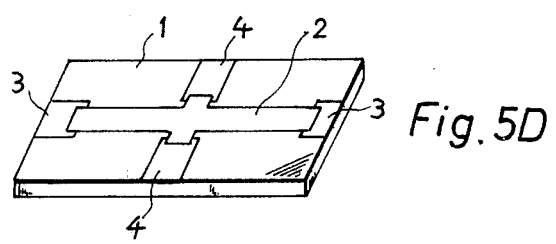

With reference to FIGS. 4A and 4B, an embodiment for analog signal detection will be described. For reading out an analog signal by the magnetic head 8 of this invention, the magnetic state record on the recording medium 5 is important. FIG. 4A shows a case, where a boundary line 5a between a magnetic domain area 7a of upward direction and a magnetic domain area 7b of downward direction along the magnetic easy axis perpendicular to the film surface normally established at the center of the width of the magnetic tape 5 is modified in a zigzag or curved line to conform to the input waveform of an external signal. When the tape 5 passes near the head 8 having the Gd-Fe film 2, which has a width sufficiently small as compared with the period of the waveform and a length corresponding to the width of the magnetic tape 5, an upwardly magnetized part 7a is transferred onto the Gd-Fe film 2 upwardly magnetize the same, and a downwardly magnetized part 7b is transferred onto the film 2 to downwardly magnetize the same. Since a Hall voltage is produced corresponding to the difference between the upward magnetization and the downward magnetization, such a signal waveform as shown in FIG. 4B is obtained.

With reference to FIGS. 5A, 5B, 5C and 5D, other embodiments of the magnetic head according to this invention will be described. In these embodiments, reference numeral 1 indicates a substrate of insulating material such as glass; 2 designates an amorphous thin film having a magnetic easy axis normal to the surface of a Gd-Fe or like film; and 3 and 4 identify current terminals and voltage terminals, respectively. In FIGS. 5A, 5B, 5C and 5D, the Gd-Fe film 2 has the shape of a cross, a strip, a rhomboid and a strip, respectively.

For employing the magnetic head for various purposes, it is preferred to form the magnetic thin film in layers. Namely, the magnetic head can be adapted so that when no information is recorded on the recording medium desired to be read out, the Hall voltage is produced having an amplitude of "1", "1" or "0". FIG. 6A shows in section an example of the construction of a multilayer magnetic thin film composed of two layers. As shown in FIG. 6A, a film 2a of large coercive force is deposited on the substrate 1 to form a thickness of 0 to 2000 Å, and then a film 2b of smaller coercive force is formed on the film 2a to a thickness of 1000 Å to 10000 Å. The B-H hysteresis curve of such a multiple film varies in accordance with the magnetization state of the film 2a. Namely, in a case where the film 2b is magnetized by a magnetic field of such an intensity which can not reverse the magnetization state of the film 2a, the magnetization curve of the film 2b assumes patterns shown in FIGS. 6B, 6C and 6D in accordance with the states "−1", "0" and "+1" of the film 2a. Accordingly, if a stray magnetic field emanating from the recording medium desired to be transferred is applied to the magnetic head in place of an external magnetic field H, the magnetic pattern of the recording medium is transferred while the magnetic head is contacted with the medium. However, when the magnetic head has separated from the recording medium, the film 2b is restored by the magnetized state of the film 2a to the state "−1", "0" or "+1" as indicated by black circles in FIGS. 6B, 6C and 6D, so that the Hall voltage corresponding to the state "−1", "0" or "1" can be obtained in accordance with the state of the film 2a.

As has been described in the foregoing, since the magnetic head of this invention utilizes transfer and the Hall effect in place of electromagnetic induction, the travelling speed of the recording medium, whether low or high, has substantially no relation to the output voltage. Accordingly, it might be said that the magnetic head of this invention is of particular utility when employed for reading out digital signals. Further, since the magnetic head produces an output even if the recording medium is at a standstill, it is also possible to employ the magnetic head as a field-to-voltage converting element by incorporating it in various home devices which employ a simple magnet or magnets. Moreover, by modifying the record pattern on the recording medium, the magnetic head can be also utilized for reading out analog signals.

What we claim is:

1. A thin film magnetic head comprising: a substrate of insulating material; an amorphous magnetic thin film deposited on the substrate, the amorphous magnetic thin film having a width smaller than each of unit areas of magnetic records on a magnetic recording medium to be separately read out therefrom and having an easy axis of manetization in a direction perpendicular to the film surface; a pair of current terminals formed on the substrate for flowing a current in the amorphous magnetic thin film in the lengthwise direction thereof; and a pair of voltage terminals formed on the substrate for deriving from the amorphous magnetic thin film a voltage induced in the transverse direction thereof.

2. A thin film magnetic head according to claim 1, wherein the amorphous magnetic thin film is formed in the shape of a strip.

3. A thin film magnetic head according to claim 1, wherein the amorphous magnetic thin film is formed in the shape of a cross.

4. A thin film magnetic head according to claim 1, wherein the amorphous magnetic thin film is formed in a rhombic shape.

5. A thin film magnetic head according to claim 1, wherein the amorphous magnetic thin film is a multilayer one.

6. A thin film magnetic head according to claim 5, wherein the amorphous magnetic thin film is composed of a first layer having a large coercive force and a thickness of less than 2000 Å, and a second layer having a small coercive force and a thickness of 1000 to 10000 Å.

7. In a thin film magnetic head: a substrate of electrically insulative material; a first amorphous magnetic thin film disposed on a surface of said substrate; and a second amorphous magnetic thin film disposed on said first amorphous magnetic thin film, wherein said first and said second amorphous magnetic thin films have respective coercive forces of different values.

8. In a thin film magnetic head according to claim 7: wherein said first amorphous magnetic thin film has a large coercive force and has a thickness less than about 2000 Å; and wherein said second amorphous magnetic thin film has a small coercive force and has a thickness between about 1,000 Å and about 10,000 Å.

* * * * *